(12) United States Patent
Lee

(10) Patent No.: US 7,148,747 B2
(45) Date of Patent: Dec. 12, 2006

(54) APPARATUS FOR AUTOMATICALLY CONTROLLING A GAIN OF A POWER AMPLIFIER AND ASSOCIATED METHODS

(75) Inventor: Kwang-du Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 165 days.

(21) Appl. No.: 10/914,123

(22) Filed: Aug. 10, 2004

(65) Prior Publication Data

US 2005/0073359 A1  Apr. 7, 2005

(30) Foreign Application Priority Data

Oct. 2, 2003  (KR) ...................... 10-2003-0068608

(51) Int. Cl.
*H03G 5/16*  (2006.01)
(52) U.S. Cl. ...................................... 330/132
(58) Field of Classification Search ................. 330/132
See application file for complete search history.

(56) References Cited

U.S. PATENT DOCUMENTS 5,270,824 A * 12/1993 Dobrovolny ................ 348/731
6,356,150 B1 * 3/2002 Spears et al. ............... 330/145
6,362,690 B1 * 3/2002 Tichauer ..................... 330/298
6,930,554 B1 * 8/2005 Mondal et al. ............. 330/282
7,031,682 B1 * 4/2006 Hayashihara ............. 455/194.2
7,054,605 B1 * 5/2006 Groe .......................... 455/254

FOREIGN PATENT DOCUMENTS

JP  2000-183675  6/2000

\* cited by examiner

*Primary Examiner*—Robert Pascal
*Assistant Examiner*—Krista M. Flanagan
(74) *Attorney, Agent, or Firm*—Lee & Morse, P.C.

(57) ABSTRACT

An apparatus for automatically controlling a gain of a power amplifier includes a reception-signal detecting unit which detects a reception signal; a reference-voltage generating unit which generates a reference voltage; a gain control voltage detecting unit which compares the detected reception signal with the generated reference voltage to detect a gain control voltage; a gain control unit which controls a gain of an input signal to output a gain signal based on the detected gain control voltage; an impedance matching unit which compensates for mismatched impedance of the gain control unit according to gain control; and a power amplifying unit which amplifies the gain signal.

13 Claims, 4 Drawing Sheets

APPARATUS FOR AUTOMATICALLY CONTROLLING A GAIN OF A POWER AMPLIFIER AND ASSOCIATED METHODS

BACKGROUND OF THE INVENTION

1. Field of the Invention

The present invention relates to an automatic gain control for a power amplifier. More particularly, the present invention relates to an apparatus and method for automatically controlling a gain of a power amplifier in which a circuit made via a complementary metal oxide semiconductor (CMOS) process is used to control the gain and effectively control a mismatched impedance caused by gain control.

2. Description of the Related Art

Automatic gain control refers to controlling a gain to maintain a magnitude of an output signal at a constant level. The magnitude of the output signal varies according to a communication distance, i.e., a distance between a base station or a repeater and a terminal. For example, for wireless communication, a gain of a power amplifier is controlled using an appropriate transmission power that compensates for interference between other users of mobile stations and for signal attenuation due to a communication distance. Generally, a power amplifier performing a gain control function includes an automatic gain control unit and a power amplifying unit.

In a conventional wireless communication terminal, the current of the power amplifier is reduced such that gain control is performed, thereby causing a nonlinear distortion of an output signal. However, this method of reducing current to control gain reduces dynamic range, thereby deteriorating the performance of the power amplifier. In order to eliminate this disadvantage, a conventional gain control unit additionally includes an off-chip component formed of a compound having good linearity. This external component, however, increases manufacturing cost and circuit size, and complicates circuit integration. Further, the conventional automatic gain control unit consumes additional power, since the gain control is still realized by reducing the current.

SUMMARY OF THE INVENTION

The present invention is therefore directed to an apparatus and method for automatically controlling a gain of a power amplifier which substantially overcomes one or more of the problems due to the limitations and disadvantages of the related art.

It is a feature of an embodiment of the present invention to provide an apparatus for automatically controlling a gain of a power amplifier which can be integrated into the power amplifier through a CMOS process.

It is another feature of an embodiment of the present invention to reduce signal distortion generated by an automatic gain control unit.

It is yet another feature of an embodiment of the present invention to minimize power consumed by automatic gain control to lengthen battery life.

At least one of the above and other features and advantages of the present invention can be realized by providing an apparatus for automatically controlling a gain of a power amplifier, including a reception-signal detecting unit which detects a reception signal, a reference-voltage generating unit which generates a reference voltage, a gain control voltage detecting unit which compares the reception signal with the reference voltage to detect a gain control voltage, a gain control unit which controls a gain of an input signal and outputs a gain signal, an impedance matching unit, connected to the gain control unit, which compensates for mismatched impedance of the gain control unit according to the gain control voltage, a matching voltage and the input signal, and a power amplifying unit which amplifies the gain signal.

The gain control unit may include an n-MOS field effect transistor (n-MOSFET) having a drain connected to a first input terminal receiving the input signal, a source connected to an output terminal for outputting the gain signal, and a gate connected to a second input terminal receiving the gain control voltage. The gain control unit may further include a first resistor connected between the drain and source of the n-MOSFET, and a second resistor connected to the source of the n-MOSFET. The gain control unit may further include a first capacitor between the first input terminal and the drain of the n-MOSFET, and a second capacitor between the output terminal and the source of the n-MOSFET. The gain control unit may further include a third resistor connected between the gate of the n-MOSFET and the second input terminal, the third resistor preventing an alternating current from leaking through the gate of the n-MOSFET.

The apparatus impedance matching unit may include an inductor, a p-MOS field effect transistor (p-MOSFET) having a drain connected to the first input terminal, a source connected to a first terminal of the inductor, and a gate connected to the second input terminal, a capacitor which is serially connected to a second terminal of the inductor, and a matching voltage source which is connected to the second terminal of the inductor in parallel with the capacitor, the matching voltage source supplying the matching voltage. The impedance matching unit may further include a fourth resistor between the gate of the p-MOSFET and the second input terminal, the fourth resistor preventing an alternating current from leaking through the gate of the p-MOSFET. The impedance matching unit may further include a fifth resistor between the matching voltage source and the inductor, the fifth resistor preventing an alternating current from leaking through the source of the p-MOSFET.

The reception-signal detecting unit may receive an amplified gain signal from the power amplifying unit to serve as the reception signal. The matching voltage may be varied to alter a gain spread across gain control voltages. Direct current may not flow into the gain control unit. The gain control unit functions as a passive unit.

At least one of the above and other features and advantages of the present invention may be realized by providing a method of automatically controlling a gain of a power amplifier, including detecting a reception signal, generating a reference voltage, comparing the reception signal with the reference voltage to detect a gain control voltage, controlling a gain of an input signal and outputting a gain signal, compensating for mismatched impedance of the controlling of the in accordance with the gain control voltage, a matching voltage and the input signal, and amplifying the gain signal.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
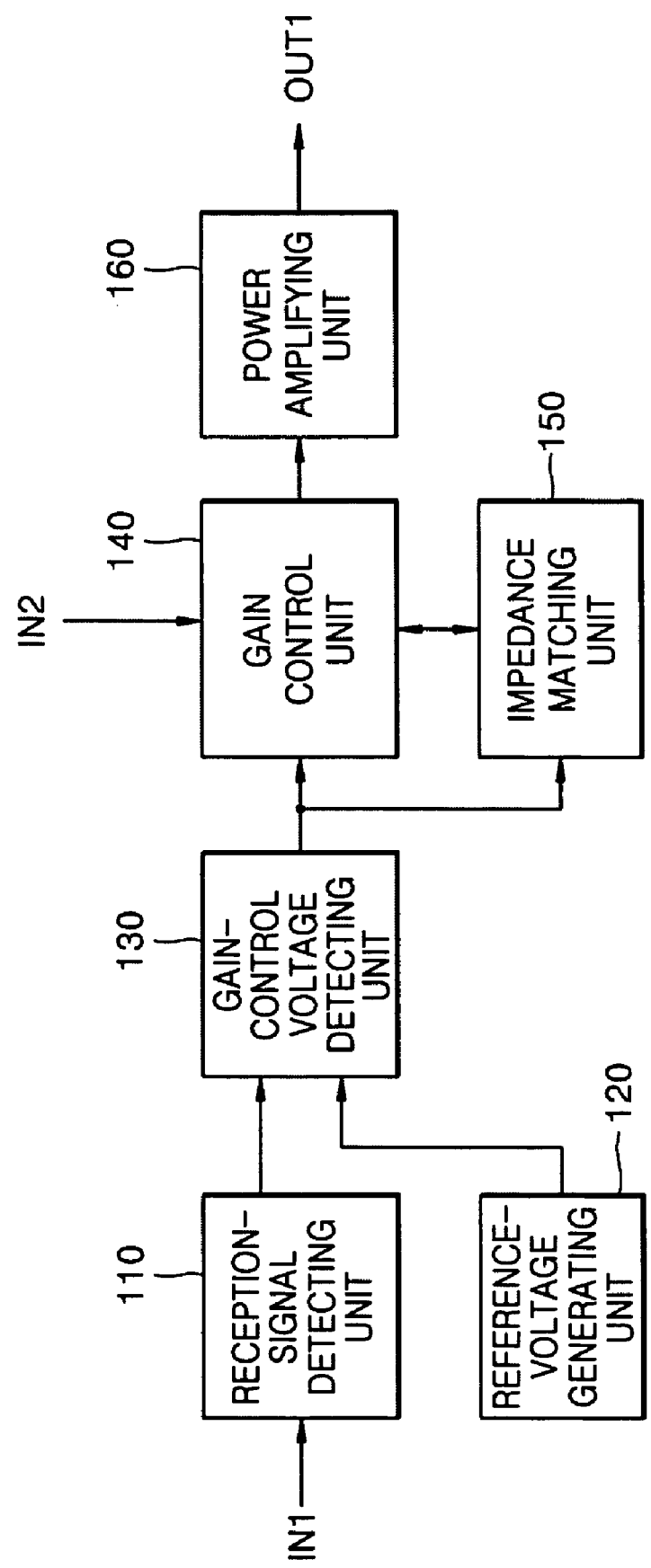
FIG. 1 is a block diagram of an apparatus for automatically controlling a gain of a power amplifier according to an embodiment of the present invention.

Korean Patent Application No. 2003-68608, filed on Oct. 2, 2003, in the Korean Intellectual Property Office, and entitled "Apparatus Controlling Automatically a Gain of a Amplifier," is incorporated by reference herein in its entirety.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

FIG. 1 is a block diagram of an apparatus for automatically controlling a gain of a power amplifier according to an embodiment of the present invention.

The apparatus for automatically controlling a gain of a power amplifier includes a reception-signal detecting unit 110, a reference-voltage generating unit 120, a gain control voltage detecting unit 130, a gain control unit 140, an impedance matching unit 150 and a power amplifying unit 160.

The reception-signal detecting unit 110 receives an amplified signal output from the power amplifying unit 160 through an input terminal IN1. The reception-signal detecting unit 110 outputs the received signal to the gain control voltage detecting unit 130. The received signal is a signal for detecting an amount of the gain in the amplified signal output from the power amplifying unit 160.

The reference-voltage generating unit 120 generates a reference voltage having a certain magnitude. This reference voltage is to be compared with the received signal detected at the reception-signal detecting unit 110. The reference-voltage generating unit 120 outputs the generated reference voltage to the gain control voltage detecting unit 130.

The gain control voltage detecting unit 130 compares the received signal from the reception-signal detecting unit 110 with the reference voltage from the reference-voltage generating unit 120. If a voltage of the received signal is lower than the reference voltage, the gain control voltage detecting unit 130 detects a high gain control voltage. If the voltage of the received signal is higher than the reference voltage, the gain control voltage detecting unit 130 detects a low gain control voltage. The gain control voltage detecting unit 130 outputs the detected gain control voltage to the gain control unit 140 and to the impedance matching unit 150.

The gain control unit 140 controls a gain of an input signal received at an input terminal IN2 in accordance with the gain control voltage from the gain control voltage detecting unit 130. The gain control unit 140 also provides the input signal to the impedance matching unit 150. The impedance matching unit 150 compensates for the mismatched impedance of the gain control unit 140. The gain control unit 140 outputs the gain-controlled signal to the power amplifying unit 160.

The power amplifying unit 160 amplifies the gain-controlled signal, and outputs the amplified gain signal through an output terminal OUT1 thereof. The amplified signal output from the power amplifying unit 160 may be transmitted through a wire or wirelessly. The amplified signal is detected at the reception-signal detecting unit 110 to be used as feedback regarding how much gain the amplified signal has.

Figure 2:
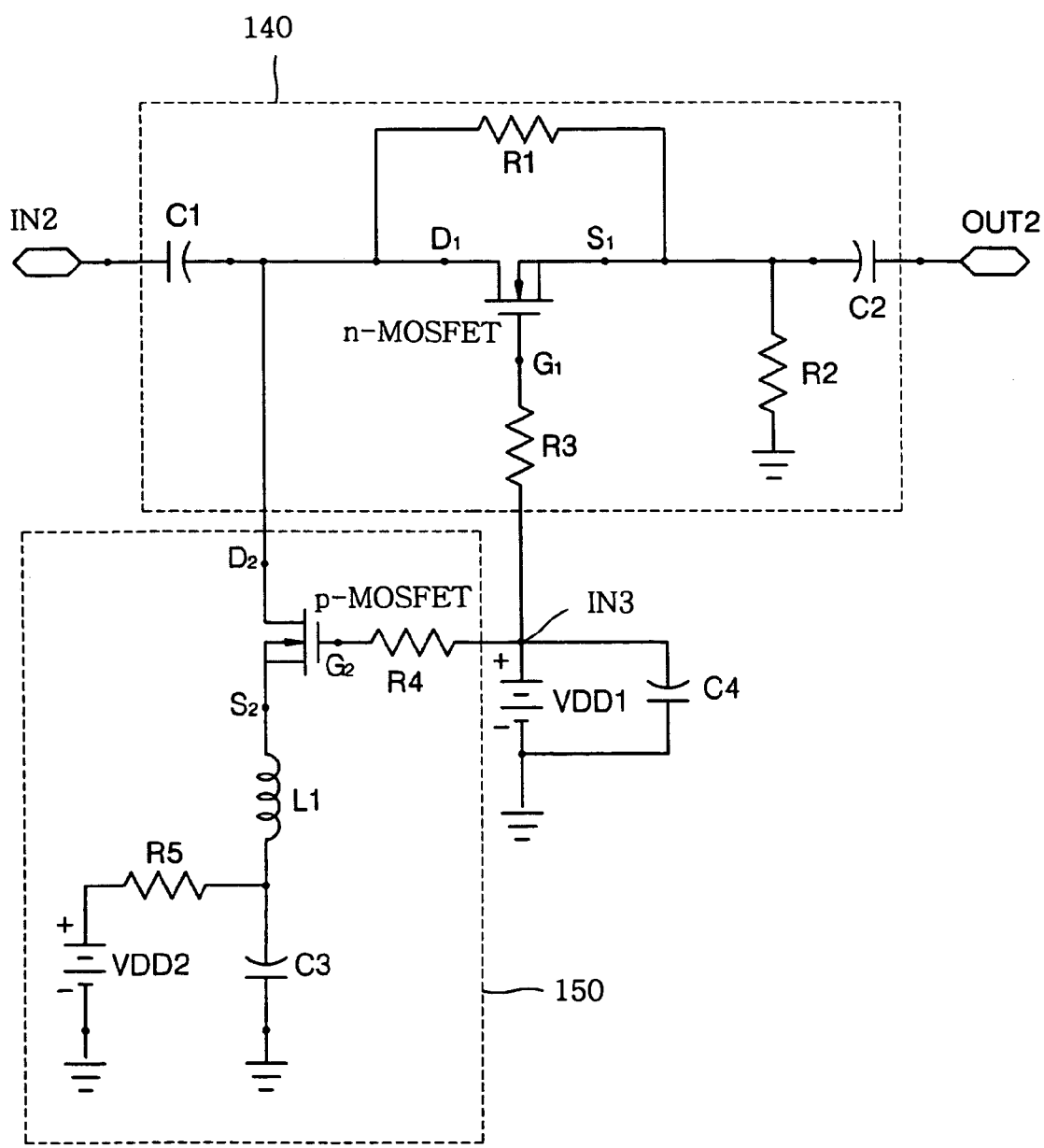
FIG. 2 is a circuit diagram of a gain control unit and an impedance matching unit shown in FIG. 1.

FIG. 2 is a circuit diagram of the gain control unit 140 and the impedance matching unit 150 shown in FIG. 1.

The gain control unit 140 receives an input signal to be gain-controlled through the input terminal IN2, controls the gain of the input signal in accordance with a gain control voltage VDD1 input through another input terminal IN3, and outputs the gain-controlled signal through an output terminal OUT2. The gain control voltage VDD1 is provided from the gain control voltage detecting unit 130.

The gain control unit 140 includes an n-MOSFET (Metal Oxide Semiconductor Field Effect Transistor).

The n-MOSFET has a drain D1 connected to the input terminal IN2, a source S1 connected to the output terminal OUT2, and a gate G1 connected to the input terminal IN3. When the gain control voltage VDD1 is applied to the gate G1 of the n-MOSFET, a channel is formed between the drain D1 and the source S1 of the n-MOSFET such that an alternating current corresponding to the magnitude of the gain control voltage VDD1 flows from the drain D1 to the source S1. That is, the input signal is gain-controlled by the gain control voltage VDD1 and is output at the output terminal OUT2.

A first resistor R1 is connected between the drain D1 and the source S1 of the n-MOSFET, and a second resistor R2 is connected to the source S1 of the n-MOSFET. The gain control unit 140 also includes a first capacitor C1 between the input terminal IN2 and the drain D1 of the n-MOSFET, and a second capacitor C2 between the output terminal OUT2 and the source S1 of the n-MOSFET. The first capacitor C1 cuts off flow of a direct current between the input terminal IN2 and the drain D1 of the n-MOSFET. The second capacitor C2 cuts off flow of a direct current between the output terminal OUT2 and the source S1 of the n-MOSFET. By cutting off the direct current as described above, power consumption can be minimized.

The gain control unit 140 further includes a third resistor R3 between the gate G1 of the n-MOSFET and the input terminal IN3. The third resistor R3 prevents an alternating current from leaking through the gate G1 of the n-MOSFET.

The impedance matching unit 150 compensates for mismatched impedance of the gain control unit 140. That is, the impedance matching unit 150 controls a conductive direction of the input signal when flow of the input signal input to the gain control unit 140 is limited by channel formation of the n-MOSFET.

The impedance matching unit 150 includes an inductor L1, a p-MOSFET, a third capacitor C3 and a matching voltage source VDD2. A first terminal of the inductor L1 is connected to a source S2 of the p-MOSFET. A second terminal of the inductor L1 is connected to the third capacitor C3 and the matching voltage source VDD2.

The p-MOSFET has a drain D2 connected to the input terminal IN2, the source S2 connected the first terminal of the inductor L1, and a gate G2 connected to the input terminal IN3.

The third capacitor C3 is serially connected to the second terminal of the inductor L1. The matching voltage source VDD2 is connected to the second terminal of the inductor L1 in parallel with the third capacitor C3. The matching voltage source VDD2 applies a bias to the source S2 of the p-MOSFET.

The impedance matching unit 150 further includes a fourth resistor R4 between the gate G2 of the p-MOSFET and the input terminal IN3. The fourth resistor R4 prevents the alternating current from leaking through the gate G2 of the p-MOSFET.

The impedance matching unit 150 also includes a fifth resistor R5 between the matching voltage source VDD2 and the inductor L1. The fifth resistor R5 prevents the alternating current from leaking through the source S2 of the p-MOSFET.

The gain control voltage VDD1 detected at the gain control voltage detecting unit 130 is applied to both the gate G1 of the n-MOSFET and the gate G2 of the p-MOSFET through the input terminal IN3. A fourth capacitor C4 may be connected in parallel with the gain control voltage VDD1 source. The matching voltage source VDD2 is fixed to a certain voltage higher than a threshold voltage of the n-MOSFET such that the gain control voltage VDD1 can control the p-MOSFET. When the gain control voltage VDD1 is higher than the matching voltage source VDD2, a voltage between the gate G1 and the source S1 of the n-MOSFET has a positive polarity higher than the threshold voltage. Thus, the channel of the n-MOSFET is opened while a conduction signal is gradually increased, and, conversely, the channel of the p-MOSFET is closed. When the gain control voltage VDD1 is lower than the matching voltage source VDD2, a voltage between the gate G2 and the source S2 of the p-MOSFET has a negative polarity lower than the threshold voltage. Thus, the channel of the n-MOSFET is closed while the channel of the p-MOSFET is opened such that a bypass is allowed.

Thus, a characteristic of a mismatched impedance of the gain control unit 140 including the n-MOSFET is improved. Accordingly, a gain can be controlled with only a positive bias using one gain control voltage VDD1, thereby minimizing the power consumption. This, in turn, reduces battery consumption, which is of great importance in wireless mobile communications.

Figure 3:
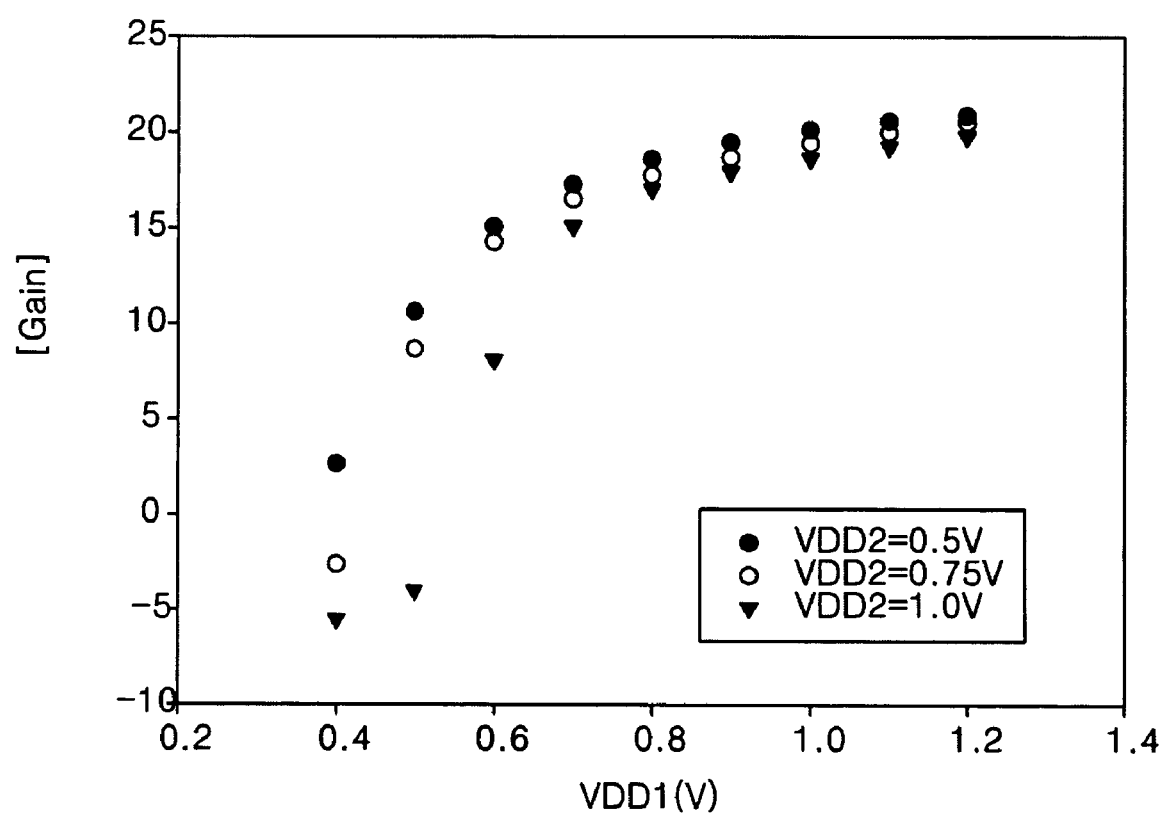
FIG. 3 is a plot of variations in a gain with respect to the magnitude of a matching voltage source.

FIG. 3 is a plot of variations in the gain with respect to the magnitude of a voltage of the matching voltage source VDD2 as the gain control voltage VDD1 is varied.

From FIG. 3, it can be seen that when the gain control voltage VDD1 is varied from 0.4 V to 1.2 V, the matching voltage source VDD2 of 1.0 V results in a wider range of gains than when the matching voltage source VDD2 has a voltage of 0.5 V. Accordingly, the matching voltage source VDD2 can be altered to control a variation in a gain of the automatically controlled gain across a range of gain control voltages VDD1.

Figure 4:
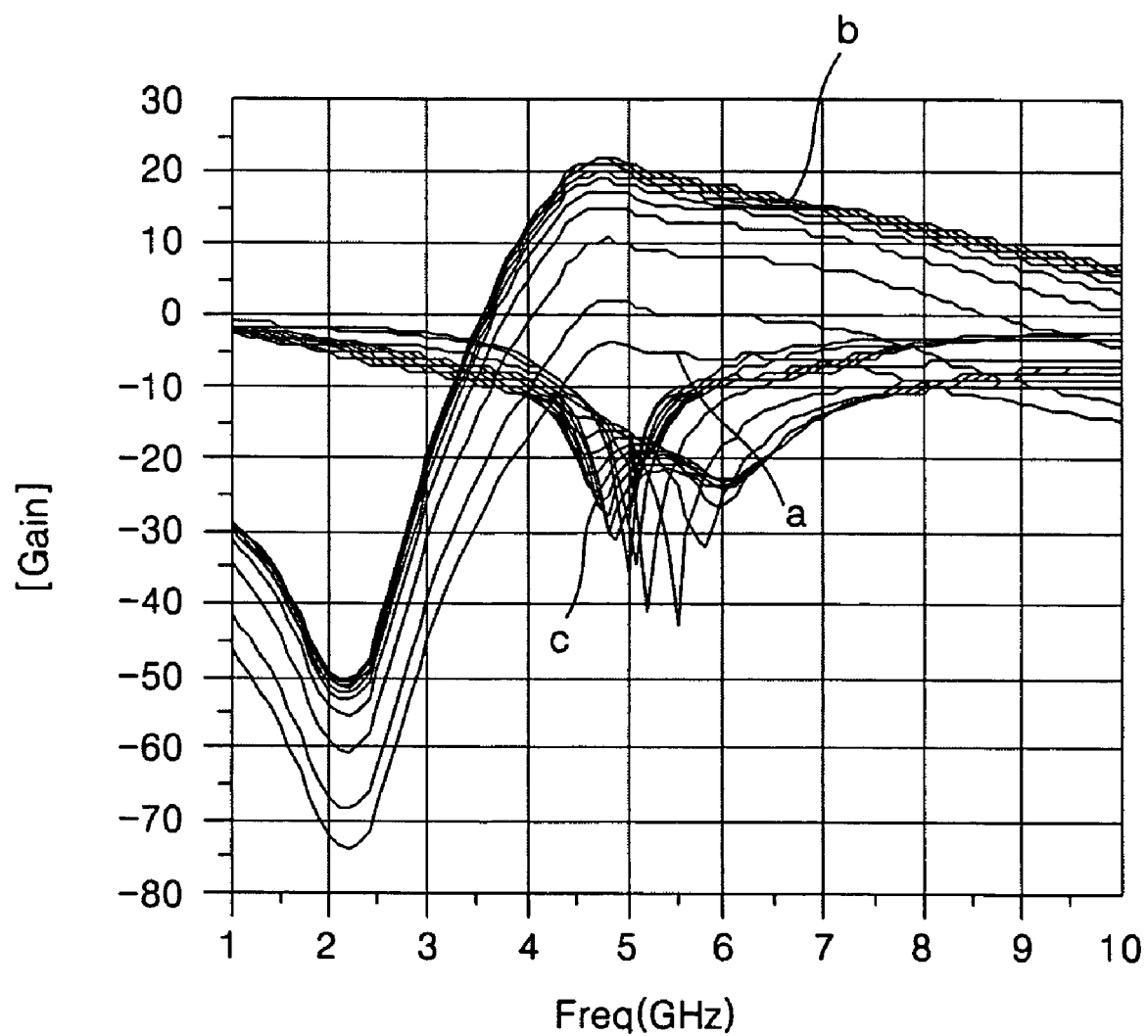
FIG. 4 is a plot of a matching characteristic depending on a variation of a gain control voltage.

FIG. 4 includes plots showing an impedance matching characteristic depending on a variation of the gain control voltage VDD1.

The gains are indicated by ⓐ to ⓑ when the gain control voltage VDD1 is varied from 0.2 V to 1.2 V. The impedance matching characteristic of the input signal corresponding to the variation of the gain is indicated by ⓒ. The impedance matching characteristic varies from 0 to −40 dB. In particular, it can be seen that when the gain is varied from −5 to 20 dB, the impedance matching characteristic, even at its most divergent at 5.2 GHz, can be below −10 dB. Thus, impedance matching is automatically performed by the impedance matching unit 150 including the p-MOSFET, according to a size of the channel of the n-MOSFET of the gain control unit 140.

As described above, the apparatus for controlling the gain of the power amplifier according to the present invention may be formed using only the CMOS process. Thus, an automatic gain control unit of the present invention may be integrated in a single chip package, thereby reducing a manufacturing cost through circuit miniaturization. Further, gain control in accordance with the present invention can be accomplished using only the positive bias due to one voltage, thereby reducing a circuit size, Additionally, since the direct current is not allowed to flow into the gain controlling circuit, power consumption is minimized. Also, the matching voltage source can be controlled to control the variation width of the automatic controlled gain. Finally, since the automatic gain control unit operates like a passive element, a signal distortion characteristic generated from an active element is prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for automatically controlling a gain of a power amplifier, comprising:
    a reception-signal detecting unit which detects a reception signal;
    a reference-voltage generating unit which generates a reference voltage;
    a gain control voltage detecting unit which compares the reception signal with the reference voltage to detect a gain control voltage;
    a gain control unit which controls a gain of an input signal and outputs a gain signal based on the detected gain control voltage;
    an impedance matching unit, connected to the gain control unit, which compensates for mismatched impedance of the gain control unit according to the gain control voltage, a matching voltage and the input signal; and
    a power amplifying unit which amplifies the gain signal.

2. The apparatus as claimed in claim 1, wherein the gain control unit comprises:
    an n-MOS field effect transistor (n-MOSFET) having a drain connected to a first input terminal receiving the input signal, a source connected to an output terminal for outputting the gain signal, and a gate connected to a second input terminal receiving the gain control voltage;
    a first resistor connected between the drain and source of the n-MOSFET; and
    a second resistor connected to the source of the n-MOSFET.

3. The apparatus as claimed in claim 2, wherein the gain control unit further comprises a first capacitor between the first input terminal and the drain of the n-MOSFET, and a second capacitor between the output terminal and the source of the n-MOSFET.

4. The apparatus as claimed in claim 3, wherein the gain control unit further comprises a third resistor connected between the gate of the n-MOSFET and the second input terminal, the third resistor preventing an alternating current from leaking through the gate of the n-MOSFET.

5. The apparatus as claimed in claim 2, wherein the impedance matching unit comprises:
   an inductor;
   a p-MOS field effect transistor (p-MOSFET) having a drain connected to the first input terminal, a source connected to a first terminal of the inductor, and a gate connected to the second input terminal;
   a capacitor which is serially connected to a second terminal of the inductor; and
   a matching voltage source which is connected to the second terminal of the inductor in parallel with the capacitor, the matching voltage source supplying the matching voltage.

6. The apparatus as claimed in claim 5, wherein the impedance matching unit further comprises a fourth resistor between the gate of the p-MOSFET and the second input terminal, the fourth resistor preventing an alternating current from leaking through the gate of the p-MOSFET.

7. The apparatus as claimed in claim 6, wherein the impedance matching unit further comprises a fifth resistor between the matching voltage source and the inductor, the fifth resistor preventing an alternating current from leaking through the source of the p-MOSFET.

8. The apparatus as claimed in claim 1, wherein the reception-signal detecting unit receives an amplified gain signal from the power amplifying unit to serve as the reception signal.

9. The apparatus as claimed in claim 1, wherein the matching voltage is varied to alter a gain spread across gain control voltages.

10. The apparatus as claimed in claim 1, wherein direct current does not flow into the gain control unit.

11. The apparatus as claimed in claim 1, wherein the gain control unit functions as a passive unit.

12. A method of automatically controlling a gain of a power amplifier, comprising:
   detecting a reception signal;
   generating a reference voltage;
   comparing the reception signal with the reference voltage to detect a gain control voltage;
   controlling a gain of an input signal and outputting a gain signal based on the detected gain control voltage;
   compensating for mismatched impedance of the gain control in accordance with the gain control voltage, a matching voltage and the input signal; and
   amplifying the gain signal.

13. The method as claimed in claim 12, wherein an amplified gain signal serves as the reception signal.

* * * * *